United States Patent
Ichijo

(10) Patent No.: US 7,223,446 B2
(45) Date of Patent: *May 29, 2007

(54) PLASMA CVD APPARATUS AND DRY CLEANING METHOD OF THE SAME

(75) Inventor: Mitsuhiro Ichijo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 246 days.

This patent is subject to a terminal disclaimer.

(21) Appl. No.: 10/752,520

(22) Filed: Jan. 8, 2004

(65) Prior Publication Data

US 2004/0139915 A1    Jul. 22, 2004

Related U.S. Application Data

(62) Division of application No. 09/818,188, filed on Mar. 26, 2001, now Pat. No. 6,675,816.

(30) Foreign Application Priority Data

Mar. 27, 2000  (JP) ............... 2000-087474

(51) Int. Cl.
- H05H 1/46 (2006.01)
- C23C 14/10 (2006.01)
- C23C 14/14 (2006.01)
- C23C 14/54 (2006.01)
- C23C 14/58 (2006.01)
- B08B 9/00 (2006.01)

(52) U.S. Cl. ............ 427/534; 427/578; 427/579; 427/569; 427/535; 134/1.1; 134/22.1; 438/905; 216/71

(58) Field of Classification Search .......... None
See application file for complete search history.

(56) References Cited

U.S. PATENT DOCUMENTS

| | | | |
|---|---|---|---|
| 4,800,174 A | | 1/1989 | Ishihara et al. |
| 4,987,005 A | | 1/1991 | Suzuki et al. |
| 5,057,185 A | * | 10/1991 | Thomas et al. ............. 438/710 |
| 5,330,578 A | | 7/1994 | Sakama et al. |
| 5,330,606 A | | 7/1994 | Kubota et al. |
| 5,529,937 A | | 6/1996 | Zhang et al. |
| 5,562,952 A | * | 10/1996 | Nakahigashi et al. ....... 427/534 |
| 5,580,792 A | | 12/1996 | Zhang et al. |
| 5,705,019 A | | 1/1998 | Yamada et al. |
| 5,779,925 A | | 7/1998 | Hashimoto et al. |
| 5,814,529 A | | 9/1998 | Zhang |
| 5,824,607 A | * | 10/1998 | Trow et al. ................. 438/732 |

(Continued)

OTHER PUBLICATIONS

Webster's Ninth New Collegiate Dictionary, Merriam-Webster Inc., Springfield, Massachusetts, USA, excerpt p. 636.*

*Primary Examiner*—Marianne Padgett
(74) *Attorney, Agent, or Firm*—Fish & Richardson P.C.

(57) ABSTRACT

In a parallel flat plate type plasma CVD apparatus, plasma damage of constituent parts in a reaction chamber due to irregularity of dry cleaning in the reaction chamber is reduced and the cost is lowered. In the parallel flat plate type plasma CVD apparatus in which high frequency voltages of pulse waves having mutually inverted waveforms are applied to an upper electrode and a lower electrode, and the inversion interval of the pulse wave can be arbitrarily changed, the interior of the reaction chamber is dry cleaned.

10 Claims, 3 Drawing Sheets

U.S. PATENT DOCUMENTS

| | | | |
|---|---|---|---|
| 5,863,339 A | 1/1999 | Usami | |
| 5,900,103 A * | 5/1999 | Tomoyasu et al. | 156/345.44 |
| 5,904,567 A | 5/1999 | Yamazaki | |
| 5,997,687 A * | 12/1999 | Koshimizu | 156/345.44 |
| 6,041,734 A * | 3/2000 | Raoux et al. | 118/723 E |
| 6,068,729 A | 5/2000 | Shrotriya | |
| 6,099,747 A | 8/2000 | Usami | |
| 6,130,118 A | 10/2000 | Yamazaki | |
| 6,214,162 B1 * | 4/2001 | Koshimizu | 156/345.28 |
| 6,245,190 B1 * | 6/2001 | Masuda et al. | 156/345.46 |
| 6,646,385 B2 * | 11/2003 | Howald et al. | 315/111.51 |
| 6,675,816 B2 * | 1/2004 | Ichijo | 134/1.1 |
| 7,141,516 B2 * | 11/2006 | Kawamura et al. | 438/795 |
| 2001/0021422 A1 * | 9/2001 | Yamakoshi et al. | 427/569 |
| 2004/0026372 A1 * | 2/2004 | Takenaka et al. | 216/71 |
| 2004/0124177 A1 * | 7/2004 | Urban et al. | 216/67 |
| 2005/0214477 A1 * | 9/2005 | Hanawa et al. | 427/569 |
| 2005/0214478 A1 * | 9/2005 | Hanawa et al. | 427/569 |
| 2005/0241670 A1 * | 11/2005 | Dong et al. | 134/1.1 |
| 2005/0241768 A1 * | 11/2005 | Kawamura et al. | 156/345.44 |
| 2005/0255255 A1 * | 11/2005 | Kawamura et al. | 427/569 |
| 2005/0279384 A1 * | 12/2005 | Guidotti | 134/18 |

* cited by examiner

PLASMA CVD APPARATUS AND DRY CLEANING METHOD OF THE SAME

CROSS-REFERENCE TO RELATED APPLICATIONS

This application is a divisional application of U.S. application Ser. No. 09/818,188, filed on Mar. 26, 2001 now U.S. Pat. No. 6,675,816, which claims the benefit of a foreign priority application filed in Japan, on Mar. 27, 2000, as serial no. JP 2000-087474. This application claims priority to all of these applications, and all of these applications are incorporated by reference.

BACKGROUND OF THE INVENTION

1. Field of the Invention

The present invention relates to a parallel flat plate type plasma CVD apparatus, and particularly to a parallel flat plate type plasma CVD apparatus having a structure suitable for dry cleaning in a reaction chamber and a dry cleaning method thereof.

2. Description of the Related Art

In fabrication of various semiconductor devices or the like, as methods of forming thin films, there are a sputtering method using a sputtering phenomenon under reduced pressure, a vacuum evaporation method using an evaporation phenomenon, a plasma CVD (Chemical Vapor Deposition) method using low temperature gas decomposition by plasma, a thermal CVD method using heat decomposition of a gas, a photo-CVD method for decomposing a gas by energy of short wavelength light or ultraviolet rays, and the like. Among these, in the plasma CVD method, a gas easy to decompose and containing an element of a thin film to be formed is supplied into a reaction chamber under reduced pressure, high frequency electric power is supplied between electrodes to generate plasma, and the supplied gas is activated by the plasma, so that an objective thin film can be formed at a low temperature. This method is used for thin film formation of an amorphous silicon film, a silicon oxide film, a silicon nitride film or the like.

However, an objective thin film is adhered to not only a surface of an object to be treated, but also a wall surface of the reaction chamber, a surface of the electrode, a shielding member, and the like. As an accumulated film thickness increases, the adhered film peels off from the wall surface of the reaction chamber, the surface of the electrode, the shielding member, and the like, so that particles are produced in the reaction chamber. Thus, there occurs a problem that the produced particles adhere to the surface of the object to be treated so that the surface is polluted and the yield is lowered. Accordingly, it is necessary to remove the adhered film when the thickness of the film adhered to the wall surface of the reaction chamber, the surface of the electrode, the shielding member, and the like reaches a predetermined accumulated film thickness, or when an operating time reaches a predetermined time. As one of methods of this removing, for example, there is dry cleaning in which an etching gas is introduced into the reaction chamber and is activated by plasma similarly to the thin film formation, and the adhered film is removed by plasma etching.

An example of the dry cleaning using the plasma etching will be explained using a parallel flat plate type plasma CVD apparatus schematically shown in FIG. 1A.

A first electrode 102 as a high frequency voltage application electrode and a second electrode 103 as a ground electrode are provided in a reaction chamber 101. The reaction chamber is kept under reduced pressure by a vacuum exhaust system 110 including a turbo molecular pump 108, a dry pump 109, and the like. Heaters (not shown) are attached to the first electrode and the second electrode, and a temperature condition suitable for the dry cleaning is kept. An etching gas used for the dry cleaning is controlled by a mass flow controller 107 to have a gas flow suitable for the dry cleaning, and is supplied into the reaction chamber through a valve 106 (hereinafter, they are collectively referred to as an etching gas supply line). Then, a high frequency voltage is supplied from a high frequency power supply 104 through a matching circuit 105 to the first electrode 102 to generate plasma, and the dry cleaning by etching is carried out. Here, since the high frequency power supply is connected to the first electrode, and the second electrode is grounded, the applying voltage waveform of the high frequency voltage becomes as schematically shown in FIG. 2A. Note, time for one period is determined as t second.

In the plasma CVD apparatus as shown in FIG. 1A, at the time of thin film formation, in order to make temperature in the reaction chamber an excellent thin film formation condition, there is a case where heater temperatures of the first electrode and the second electrode are set to different values. Besides, since the high frequency voltage is supplied to the first electrode and the second electrode is grounded, the deposition mechanisms of films adhered to the wall surface of the reaction chamber, the surface of the electrode, and the like become different from one another, so that the film qualities and accumulated film thicknesses are also different. Further, also in the case where the dry cleaning by the plasma etching is carried out, by the same factor, the etching mechanisms become different among the wall surface of the reaction chamber, the surface of the electrode, and the like, so that etching speeds are also different, and removal of the adhered films is irregular.

For example, in the plasma CVD apparatus as shown in FIG. 1A, the adhered films are etched and removed in the order of FIGS. 3A, 3B and 3C. That is, the films are removed in the order of the second electrode, the wall surface of the reaction chamber from the vicinity of the second electrode to the vicinity of the first electrode, and the first electrode, that is, with directionality from the second electrode to the first electrode. It appears that this is caused since in the case of the first electrode, although a chemical etching progresses by a chemical reaction of an active radical and the adhered film, in the case of the second electrode, a small number of ions exist together with the active radical, and in addition to a chemical etching by those ions, a physical etching by a sputtering effect is also added. Since the adhered films on the second electrode, in the vicinity of the second electrode, and the like are removed in this way earlier than the first electrode, they are forced to receive plasma irradiation in the state where the surfaces are exposed, so that the damage by plasma has been serious.

Besides, since the removal of the adhered films is irregular, a time required to completely remove the adhered films becomes long, and superfluous gas, electric power and the like are consumed by that.

SUMMARY OF THE INVENTION

The constitution of the present invention is a parallel flat plate type plasma CVD apparatus and a dry cleaning method thereof, which is characterized by including a matching circuit, a first change-over switch, and a pulse amplitude modulation circuit between a high frequency power supply and a first electrode and between the high frequency power supply a second electrode, and an inverter circuit, a second change-over switch, and a wiring line for ground between the first change-over switch and the second electrode.

The dry cleaning method of the parallel flat plate type plasma CVD apparatus is such that after an etching gas is supplied into a reaction chamber, pulse amplitude modulated high frequency voltages are applied through the pulse amplitude modulation circuit to the first electrode and the second electrode. At this time, the phase of the pulse amplitude modulated high frequency voltage applied to the second electrode is shifted by 180° with respect to the first electrode through the inverter circuit.

Besides, in accordance with irregularity in the adhesion of adhered films in the reaction chamber, that is, in accordance with irregularity in the film quality and accumulated film thickness of the adhered films in the reaction chamber, and in accordance with irregularity in plasma etching, a pulse interval of a signal wave for pulse amplitude modulation is arbitrarily selected.

DETAILED DESCRIPTION OF THE INVENTION

A mode for carrying out the present invention will be described with reference to FIGS. 1B and 2B.

Figure 1B:
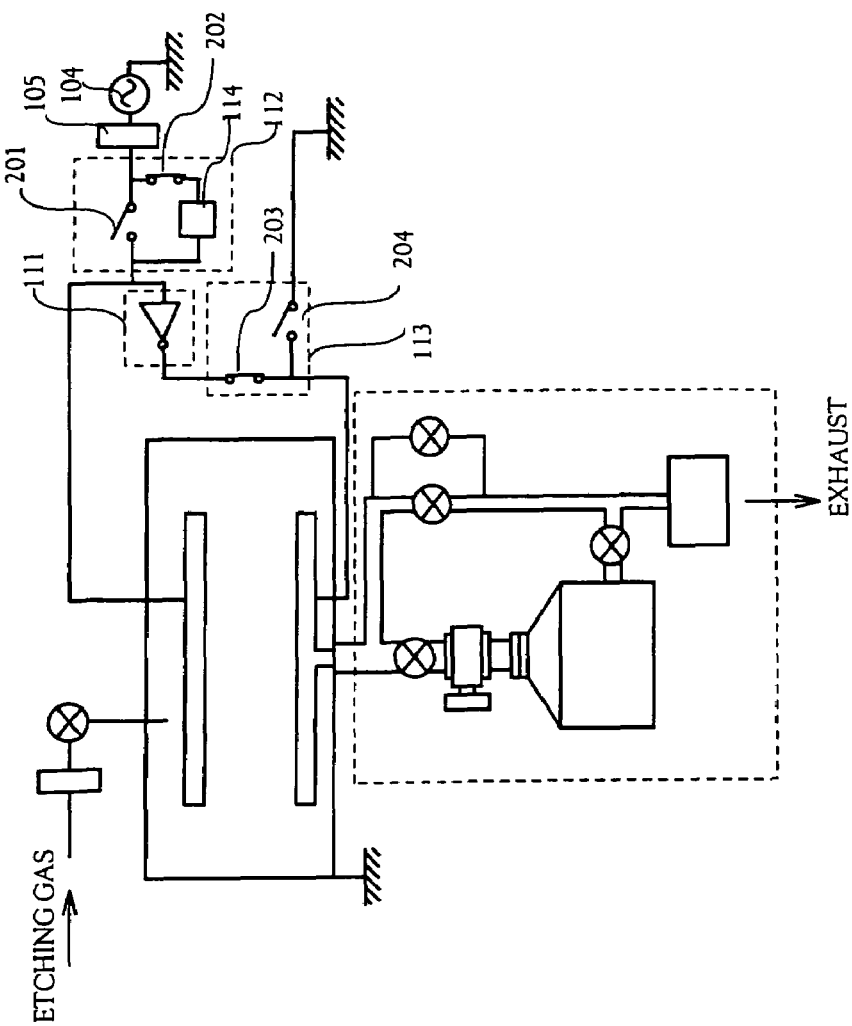
FIGS. 1A and 1B are schematic views respectively showing a structure of a conventional parallel flat plate type plasma CVD apparatus and a parallel flat plate type plasma CVD apparatus of the present invention.
Figure 1A:
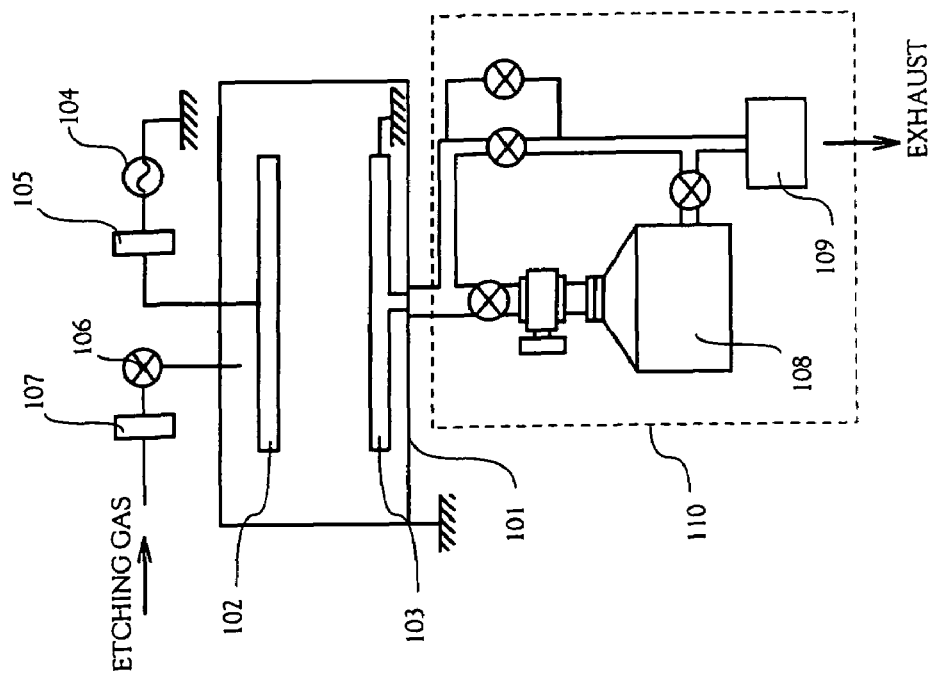
Figure 2A:
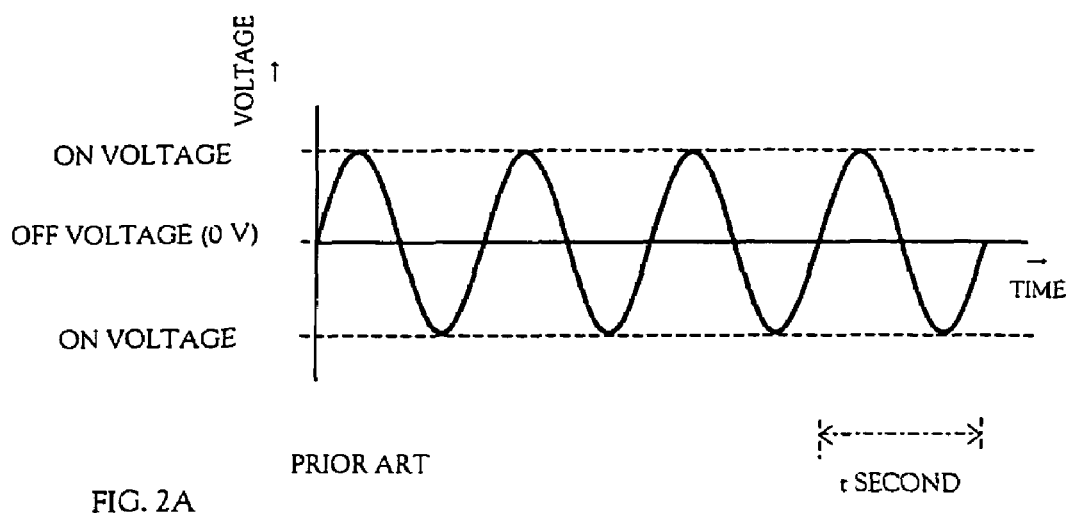
FIGS. 2A and 2B are views respectively showing a waveform of a voltage applied to an electrode from a high frequency power supply in the conventional parallel flat plate type plasma CVD apparatus and in the parallel flat plate type plasma CVD apparatus of the present invention.
Figure 2B:
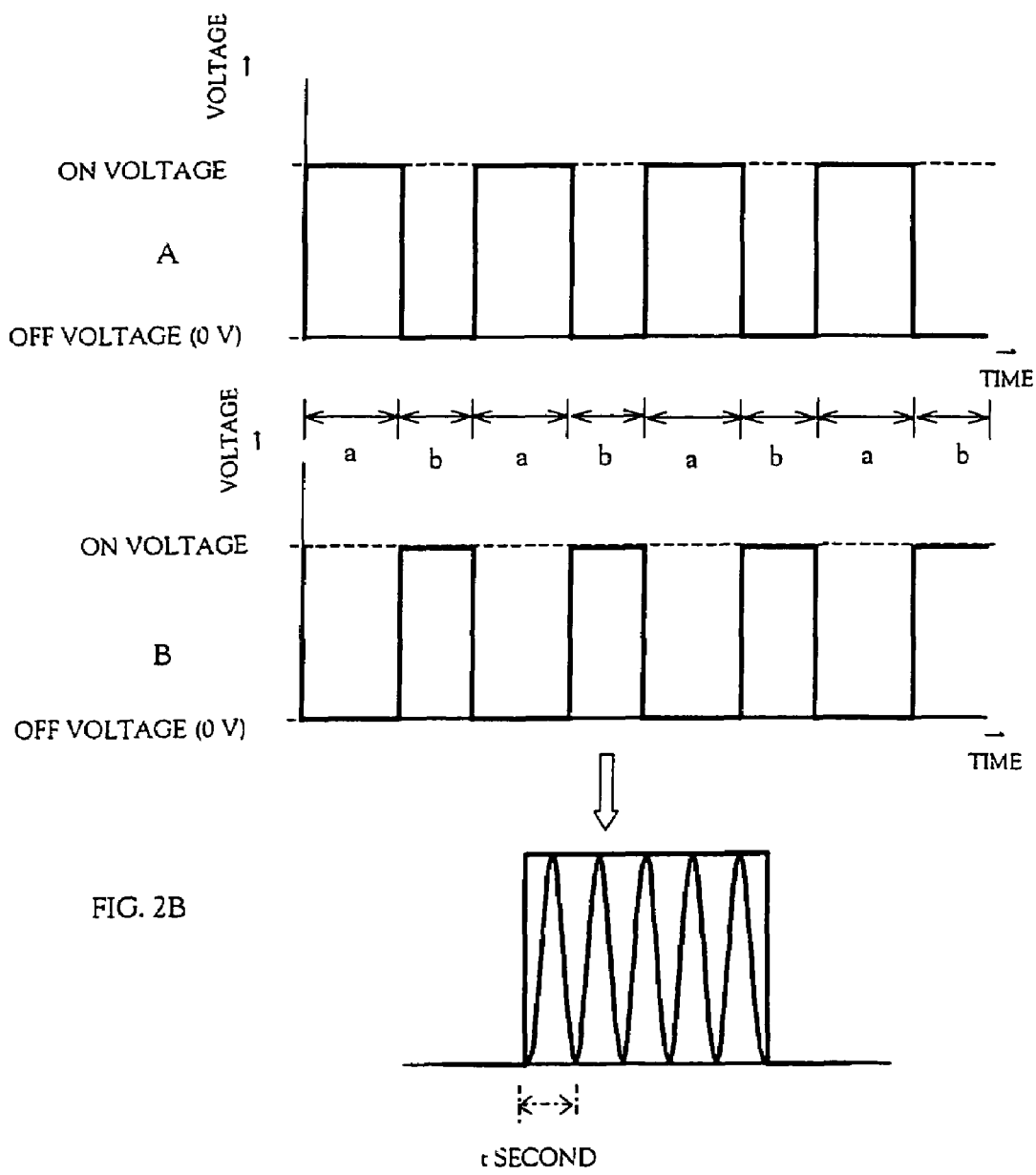
Figure 3A:
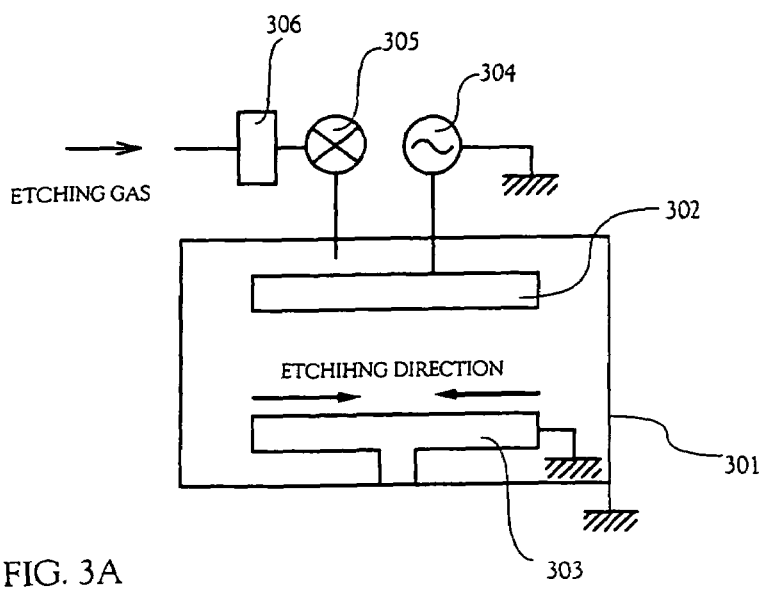
FIGS. 3A to 3C are views showing a removal process of adhered films by plasma etching in the conventional parallel flat plate type plasma CVD apparatus.
Figure 3B:
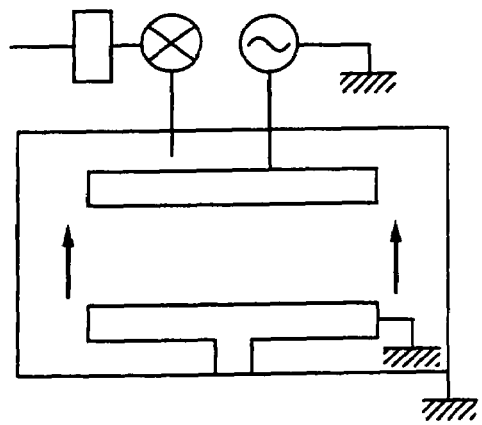
Figure 3C:
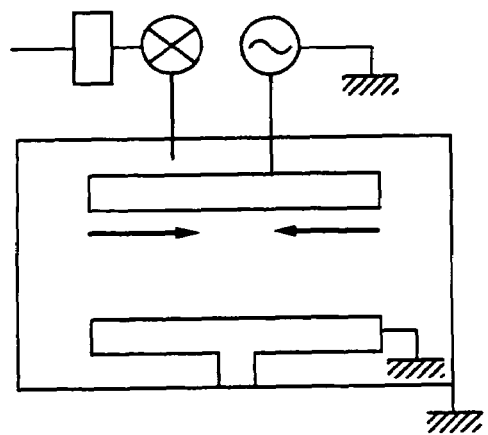

FIG. 1B schematically shows a plasma CVD apparatus of the present invention. Its constitution, such as a structure in a reaction chamber, an etching gas supply line, and a vacuum exhaust system, is the same as the conventional plasma CVD apparatus of FIG. 1A, and this plasma CVD apparatus is also the same as the conventional plasma CVD apparatus in that an etching gas is supplied from the etching gas supply line into the reaction chamber to generate plasma and dry cleaning is carried out by plasma etching. The different point from the conventional plasma CVD apparatus of FIG. 1A is an application method of a high frequency voltage at the time of dry cleaning, that is, a generating method of plasma.

Specifically, although pulse amplitude modulated high frequency voltages are applied to the first electrode 102 and the second electrode 103, the high frequency voltage whose phase is shifted by 180° with respect to the first electrode 102 is applied to the second electrode 103. By this, the relation of a high frequency voltage application electrode and a ground electrode between the first electrode 102 and the second electrode 103 is alternately inverted. For that purpose, as shown in FIG. 1B, a pulse amplitude modulation circuit 114 and an inverter circuit 111 are provided in a line for applying the high frequency voltage from a high frequency power supply 104. Besides, in general, at the time of thin film formation, since the first electrode 102 is made the high frequency voltage application electrode, and the second electrode 103 is made the ground electrode, there are provided change-over switches 112 and 113 for changing over the relation of the high frequency voltage application electrode and the ground electrode between the time of thin film formation and the time of dry cleaning. For example, when switches 201–204 are respectively switched OFF, ON, ON, and OFF, it becomes possible to alternately invert the relation of the high frequency voltage application electrode and the ground electrode between the first electrode 102 and the second electrode 103, so that the dry cleaning can be carried out. When the switches 201–204 are respectively switched ON, OFF, OFF, and ON, the first electrode 102 can be made the high frequency voltage application electrode, and the second electrode 103 can be made the ground electrode, so that the thin film formation can be carried out.

The dry cleaning is carried out in such a manner that after the etching gas is supplied into the reaction chamber from the etching gas supply line under reduced pressure, the pulse amplitude modulated high frequency voltages are applied to the first electrode and the second electrode from the high frequency power supply to perform plasma etching. The high frequency voltages applied to the first electrode and the second electrode have phases shifted by 180° from each other by the inverter provided between the high frequency power supply and the second electrode. Here, a time in which a voltage (ON voltage) is applied to the first electrode to make it the high frequency voltage application electrode and a voltage (OFF voltage) is applied to the second electrode to make it the ground electrode is made "a", a time in which the voltage (ON voltage) is applied to the second electrode to make it the high frequency voltage application electrode and the voltage (OFF voltage) is applied to the first electrode to make it the ground electrode is made "b", and a/(a+b) is made a duty ratio of a pulse wave. This duty ratio is arbitrarily selected in accordance with irregularity in the adhesion of the adhered films in the reaction chamber, that is, in accordance with irregularity in the film quality and accumulated film thickness of the adhered films in the reaction chamber, and in accordance with irregularity in plasma etching, so that the adhered films can be uniformly removed. Specifically, it is sufficient if a pulse width of a signal wave for pulse amplitude modulating a high frequency voltage is arbitrarily selected. Incidentally, it is not always necessary that the OFF voltage is set to 0 V, but a slight voltage may be applied. Matching of a traveling wave and a reflected wave of plasma is performed by a matching circuit 105 at each place in FIG. 2B where a pulse wave rises, and this matching becomes easy by applying the slight voltage.

In the manner described above, plasma damage of the wall surface and the electrode in the reaction chamber caused by the irregularity in the film quality and accumulated film thickness of the adhered films in the reaction chamber and the irregularity in the plasma etching is prevented. Besides, hitherto, a treatment time is superfluously long since there is a portion where the removing process is slow. However, since the adhered films can be uniformly removed, a treatment time can be shortened and the consumption of gas, electric power and the like is reduced.

[Embodiment]

An embodiment of the present invention will be described with reference to FIG. 1B. Here, it is assumed that films adhered to the wall surface, the electrodes and the like in the reaction chamber are silicon oxide films, and a dry cleaning method at the time when a presumed accumulated film thickness of this adhered silicon oxide film reaches a predetermined film thickness at which dry cleaning is required, will be described.

The temperature in the reaction chamber, that is, the set temperature of heaters (first heater and second heater) attached to the first electrode and the second electrode is made the same condition as the time when the silicon oxide film as an object to be removed is formed. By this, it becomes unnecessary to take a time for adjusting the temperature in the reaction chamber to perform the dry cleaning. Here, the first heater and the second heater were respectively made 300° C. Of course, since the set temperatures of the adhered films at the time of film formation are respectively different, and there is also a case where the temperatures are set to different values between the first heater and the second heater, the temperature in the reaction chamber at the time of the dry cleaning is not limited to this. Besides, according to the film quality of the adhered film, temperature adjustment may be performed to set the temperature to a value suitable for the dry cleaning.

First, in order to avoid danger by a chemical reaction in exhaust piping, the exhaust piping is changed over from piping dedicated for a thin film forming gas to piping dedicated for an etching gas by a valve (not shown). Thereafter, the vacuum exhaust system 110 is used to evacuate the reaction chamber to a predetermined pressure. During this, an interval between the first electrode 102 and the second electrode 103 is set to a condition suitable for plasma generation. Here, it was made 25 mm. When the pressure is reduced to the predetermined pressure, next, a $N_2$ purge is carried out under a pressure of $1.07 \times 10^2$ Pa and a flow of 200 SCCM. Then, evacuating is again performed to reduce the pressure to a predetermined value.

In the manner described above, an unreacted gas and the like remaining in the piping system in the CVD apparatus is removed to perform cleaning. After cleaning of the piping system is performed, $NF_3$ as the etching gas for the dry cleaning is supplied into the reaction chamber through the control valve 106 after the flow is controlled by the mass flow controller 107 to 100 SCCM, and the pressure is adjusted to a value suitable for the dry cleaning. Here, the pressure was made $1.33 \times 10^1$ Pa.

Next, pulse amplitude modulated high frequency voltages are applied to the first electrode 102 and the second electrode 103 from the high frequency power supply 104 to generate plasma so that the dry cleaning is performed by plasma etching. Before the high frequency voltages are applied, the change-over switches 112 and 113 for changing over a voltage application method to the electrodes are previously changed over from one for thin film formation to one for dry cleaning. Besides, in accordance with irregularity in the adhesion of the adhered films in the reaction chamber, that is, in accordance with irregularity in the film quality and accumulated film thickness of the adhered films in the reaction chamber, and in accordance with irregularity in the plasma etching, the pulse interval (duty ratio) of a signal wave is arbitrarily set in the pulse amplitude modulation circuit. The operation of changing over the voltage application method and the setting of the duty ratio may be carried out at any time before the voltage is applied. Here, the voltage application method for the thin film formation is a method in which the first electrode 102 is made the high frequency voltage application electrode and the second electrode 103 is made the ground electrode. The voltage application method for the dry cleaning is a method in which pulse amplitude modulated high frequency voltages are applied to the first electrode 102 and the second electrode 103, the waveform of the high frequency voltage applied to the second electrode 103 becomes a waveform whose phase is shifted by 180° with respect to the first electrode 102, and the relation of the high frequency voltage application electrode and the ground electrode is inverted with a predetermined period between the first electrode 102 and the second electrode 103.

After the dry cleaning by the plasma etching is ended, the reaction chamber is evacuated to a predetermined pressure by using the vacuum exhaust system 110. Next, a $N_2$ purge is carried out under a pressure of $1.07 \times 10^2$ Pa and a flow of 200 SCCM. Then, evacuating is again carried out to reduce the pressure to a predetermined value. By this, an unreacted gas and the like remaining in the piping system in the CVD apparatus is removed to carry out cleaning. During this, the interval between the first electrode 102 and the second electrode 103 is made to return to the initial value.

In the manner described above, the films adhered to the wall surface of the reaction chamber, the electrodes, and the like of the plasma CVD apparatus are uniformly removed to prevent plasma damage of the wall surface of the reaction chamber, the electrodes, and the like, and a treatment time is shortened. Incidentally, in this embodiment, the method of dry cleaning for removing the silicon oxide film has been described, the present invention can also be applied to a thin film such as an amorphous silicon film or a silicon nitride film formed by using the parallel flat plate type plasma CVD apparatus by arbitrarily selecting conditions. Besides, the conditions such as pressure and temperature at the time of the dry cleaning are not limited to those disclosed in this embodiment, but may be arbitrarily selected.

According to the present invention, since films adhered to the wall surface of the reaction chamber, electrodes and the like as constituent parts in the reaction chamber can be uniformly removed, plasma damage of the constituent parts in the reaction chamber due to irregular plasma etching can be suppressed, and the consumption of gas and electric power can be suppressed by shortening of the treatment time, so that the cost of the dry cleaning to remove the films adhered to the constituent parts in the reaction chamber can be reduced.

What is claimed is:

1. A method comprising:

performing a plasma CVD to form a film on a surface of an object in a reaction chamber of a plasma CVD apparatus, wherein said plasma CVD apparatus comprises:

a high frequency power supply;

a first electrode and a second electrode in the reaction chamber;

a matching circuit between the high frequency power supply and the first electrode and between the high frequency power supply and the second electrode;

a first change-over switch between the high frequency power supply and the first electrode and between the high frequency power supply and the second electrode;

a pulse amplitude modulation circuit between the high frequency power supply and the first electrode and between the high frequency power supply and the second electrode;

an inverter circuit between the first change-over switch and the second electrode;

a second change-over switch between the first change-over switch and the second electrode; and a wiring line for ground between the first change-over switch and the second electrode;

after performing the plasma CVD, cleaning an inside of the reaction chamber by a process comprising:

introducing an etching gas into the plasma CVD chamber;

applying a pulse amplitude modulated high frequency voltage through the pulse amplitude modulation circuit to the first electrode by changing the first change-over switch; and applying a high frequency voltage having a phase, which is shifted by 180° from the pulse amplitude modulated high frequency voltage, to the second electrode in order to produce plasma of said etching gas, wherein said high frequency voltage is pulse amplitude modulated through the pulse amplitude modulation circuit by changing the first change-over switch and directed through the inverter circuit by changing the second change-over switch.

2. The method according to claim 1 wherein said film comprises a material selected from the group consisting of silicon oxide, silicon, and silicon nitride.

3. A method comprising:
performing a plasma CVD to form a film on a surface of an object in a reaction chamber of a plasma CVD apparatus, wherein said plasma CVD apparatus comprises:
a high frequency power supply;
a first electrode and a second electrode in the reaction chamber;
a matching circuit between the high frequency power supply and the first electrode and between the high frequency power supply and the second electrode;
a first change-over switch between the high frequency power supply and the first electrode and between the high frequency power supply and the second electrode;
a pulse amplitude modulation circuit between the high frequency power supply and the first electrode and between the high frequency power supply and the second electrode;
an inverter circuit between the first change-over switch and the second electrode;
a second change-over switch between the first change-over switch and the second electrode; and
a wiring line for ground between the first change-over switch and the second electrode;
after performing the plasma CVD, cleaning an inside of the reaction chamber by a process comprising:
introducing an etching gas into the plasma CVD chamber;
applying a pulse amplitude modulated high frequency voltage through the pulse amplitude modulation circuit to the first electrode by changing the first change-over switch; and
applying a high frequency voltage having a phase, which is shifted by 180° from the pulse amplitude modulated high frequency voltage, to the second electrode in order to produce plasma of said etching gas,
wherein said high frequency voltage is pulse amplitude modulated through the pulse amplitude modulation circuit by changing the first change-over switch and directed through the inverter circuit by changing the second change-over switch, and
wherein the pulse amplitude modulation circuit arbitrarily selects a pulse width of a signal wave for pulse amplitude modulation.

4. The method according to claim 3 wherein said film comprises a material selected from the group consisting of silicon oxide, silicon, and silicon nitride.

5. A method comprising:
forming a film on a surface of an object by a plasma CVD in a reaction chamber of a plasma CVD apparatus, wherein said plasma CVD apparatus comprises:
a high frequency power supply:
a first electrode and a second electrode in the reaction chamber;
a first change-over switch between the high frequency power supply and the first electrode and between the high frequency power supply and the second electrode;
a second change-over switch between the first change-over switch and the second electrode; and
a wiring line for ground between the first change-over switch and the second electrode;

after forming the film, cleaning an inside of the reaction chamber by a process including:
introducing an etching gas into the plasma CVD chamber;
applying a first pulse amplitude modulated high frequency voltage through a pulse amplitude modulation circuit to the first electrode by changing the first change-over switch; and
applying a second pulse amplitude modulated high frequency voltage having a phase, which is shifted from the first pulse amplitude modulated high frequency voltage, to the second electrode in order to produce plasma of said etching gas,
wherein said second pulse amplitude modulated high frequency voltage is pulse amplitude modulated through the pulse amplitude modulation circuit by changing the first change-over switch and directed through an inverter circuit by changing the second change-over switch.

6. The method according to claim 5 wherein said film comprises a material selected from the group consisting of silicon oxide, silicon, and silicon nitride.

7. A method comprising:
forming a film on a surface of an object by a plasma CVD in a reaction chamber including a first electrode and a second electrode; and
after forming the film, cleaning an inside of the reaction chamber by a process including:
introducing an etching gas into the plasma CVD chamber,
applying a first pulse amplitude modulated high frequency voltage to the first electrode by using a high frequency power supply, and
applying a second pulse amplitude modulated high frequency voltage to the second electrode in order to produce plasma of said etching gas by using the high frequency power supply,
wherein the second pulse amplitude modulated high frequency voltage has an opposite phase to the first pulse amplitude modulated high frequency voltage.

8. The method according to claim 7 wherein said film comprises a material selected from the group consisting of silicon oxide, silicon, and silicon nitride.

9. A method comprising:
forming a film on a surface of an object by a plasma CVD in a reaction chamber including a first electrode and a second electrode; and
after forming the film, cleaning an inside of the reaction chamber by a process including:
introducing an etching gas into the plasma CVD chamber,
applying a first pulse amplitude modulated high frequency voltage to the first electrode by using a high frequency power supply, and
applying a second pulse amplitude modulated high frequency voltage to the second electrode in order to produce plasma of said etching gas by using the high frequency power supply,
wherein the second pulse amplitude modulated high frequency voltage is phase shifted from the first pulse amplitude modulated high frequency voltage at 180°.

10. The method according to claim 9 wherein said film comprises a material selected from the group consisting of silicon oxide, silicon, and silicon nitride.

* * * * *